(12) United States Patent
Drahotsky (10) Patent No.: US 12,070,753 B2
(45) Date of Patent: Aug. 27, 2024

(54) METHOD FOR TEMPERATURE MONITORING IN CRYO-ELECTRON MICROSCOPY

(71) Applicant: FEI Company, Hillsboro, OR (US)

(72) Inventor: Jakub Drahotsky, Brno (CZ)

(73) Assignee: FEI Company, Hillsboro, OR (US)

( * ) Notice: Subject to any disclaimer, the term of this patent is extended or adjusted under 35 U.S.C. 154(b) by 1132 days.

(21) Appl. No.: 16/834,973

(22) Filed: Mar. 30, 2020

(65) Prior Publication Data

US 2021/0299665 A1    Sep. 30, 2021

(51) Int. Cl.
| | |
|---|---|
| *B01L 7/00* | (2006.01) |
| *G01N 1/28* | (2006.01) |
| *G01N 1/42* | (2006.01) |
| *H01J 37/20* | (2006.01) |
| *H01J 37/26* | (2006.01) |
| *G01N 23/203* | (2006.01) |
| *G01N 23/225* | (2018.01) |

(52) U.S. Cl.
CPC .............. *B01L 7/50* (2013.01); *G01N 1/2813* (2013.01); *G01N 1/42* (2013.01); *H01J 37/20* (2013.01); *H01J 37/26* (2013.01); *G01K 2203/00* (2013.01); *G01N 23/203* (2013.01); *G01N 23/225* (2013.01); *G01N 2223/053* (2013.01); *G01N 2223/071* (2013.01); *G01N 2223/102* (2013.01); *H01J 2237/2001* (2013.01); *H01J 2237/2065* (2013.01); *H01J 2237/24585* (2013.01)

(58) Field of Classification Search
CPC .......... B01L 7/50; G01N 1/2813; G01N 1/42; G01N 23/203; G01N 23/225; G01N 2223/053; G01N 2223/071; G01N 2223/102; H01J 37/20; H01J 37/26; H01J 2237/2001; H01J 2237/2065; H01J 2237/24585; G01K 2203/00
See application file for complete search history.

(56) References Cited

U.S. PATENT DOCUMENTS

| | | | | |
|---|---|---|---|---|
| 3,723,694 | A * | 3/1973 | Conta | H01C 17/2408 219/69.17 |
| 5,892,237 | A * | 4/1999 | Kawakami | H01J 37/3174 250/491.1 |

(Continued)

FOREIGN PATENT DOCUMENTS

EP    2458354 A1    3/2012

OTHER PUBLICATIONS

Extended European Search Report from European Application No. 21164765.6, dated Aug. 20, 2021, 7 pages.

(Continued)

*Primary Examiner* — Nathaniel T Woodward
*Assistant Examiner* — Philip L Cotey
(74) *Attorney, Agent, or Firm* — Klarquist Sparkman, LLP (57) ABSTRACT

Temperatures of cryo-electron microscopy samples are assessed based on images portions associated with high temperature superconductor (HTSC) areas or other thermal sensor materials that are thermally coupled to or thermally proximate the samples. Such thermal areas can be provided on sample mounts such as metallic grids, carbon films, or on sample stages. In examples using HTSCs, HTSCs having critical temperatures between −175° C. and −135° C. are typically used.

19 Claims, 11 Drawing Sheets

(56) References Cited

U.S. PATENT DOCUMENTS

| | | | | |
|---|---|---|---|---|
| 6,072,922 | A * | 6/2000 | Albin | G01K 13/006 374/E11.015 |
| 2001/0031407 | A1* | 10/2001 | Okino | H01J 37/3174 430/30 |
| 2002/0125447 | A1* | 9/2002 | Udagawa | H01J 37/304 250/492.23 |
| 2008/0293577 | A1* | 11/2008 | Wong | H10N 60/203 505/850 |
| 2009/0202194 | A1* | 8/2009 | Bosselmann | G01K 11/3206 374/161 |
| 2010/0155596 | A1* | 6/2010 | Xiao | G01N 23/2202 392/416 |
| 2010/0320381 | A1* | 12/2010 | Zhao | H01J 37/28 250/306 |
| 2012/0112068 | A1* | 5/2012 | Maeda | H01J 37/265 250/310 |
| 2012/0128028 | A1* | 5/2012 | van den Boom | H01J 37/26 374/159 |
| 2012/0201268 | A1* | 8/2012 | Boyd | G01K 13/006 374/33 |
| 2014/0268130 | A1* | 9/2014 | Omichi | G01J 3/4412 356/301 |
| 2016/0047763 | A1* | 2/2016 | Omichi | G01K 1/14 374/161 |
| 2017/0221676 | A1* | 8/2017 | Sunaoshi | H01J 37/28 |
| 2020/0064199 | A1* | 2/2020 | Magel | G01J 5/025 |
| 2021/0272829 | A1* | 9/2021 | Bruurs | H01J 37/28 |
| 2021/0299665 | A1* | 9/2021 | Drahotsky | G01N 1/2813 |

OTHER PUBLICATIONS

Hofstätter und Hörle, "Bestimmung lokaler Temperaturen gekühlter Präparate im Durchstrahlungselektronenmikroskop," *Micron* (1969), 7: 67-70 (Jan. 1976).

Shaikh et al., "Implementation of a flash-photolysis system for time-resolved cryo-electron microscopy," *Journal of Structural Biology*, 165(3): 184-189 (Mar. 2009).

Vyas et al., "Observations of YBCO superconductors under a low-temperature scanning electron microscope," *AIP Conference Proceedings*, 483:347-350 (1999).

Chen et al., "Tl2Ba2Ca2Cu3Ox Thin-Film D.C.—Squids With Operation Temperature Near 100 K," Applied Superconductivity, 3(7-10):463-467 (Jul.-Oct. 1995).

EP Search Report for Related EP Application No. 21164756.6, mailed Mar. 28, 2024, 5 pages.

Faulques et al., "Iodine insertion in high-Tc cuprates—Raman, magnetization, X-ray photoelectron and electron energy loss measurements," Physica C 219:297-314 (Jan. 15, 1994).

Zhang et al., "New structural aspects of Tl2Ba2CaCu2Oy epitaxial thin films grown by MOCVD on LaAlO3," Physica C 275:146-154 (1997).

\* cited by examiner

METHOD FOR TEMPERATURE MONITORING IN CRYO-ELECTRON MICROSCOPY

FIELD

The disclosure pertains to assessment of sample temperature in cryo-electron microscopy.

BACKGROUND

Cryo-electron tomography (cryo-ET) is based on a freezing technique that captures cellular water in an amorphous (glass-like) layer in which all cellular components are embedded. This process is known as vitrification. Samples must generally be held at temperatures below about −135° C. to avoid devitrification or degradation, but in most cases, temperatures below −150° C. are preferred to provide a margin of error. In many cases it is difficult to assess the temperature of such small samples and difficult to determine whether or not they have been maintained properly at low temperatures. This is especially challenging after samples are mounted on an electron microscope substrate stage. If a sample is not properly maintained at a low temperature, the sample will no longer exhibit its original structure. In some cases, a great deal of instrument time may be required to process a sample, only to discover later that the sample has not been properly maintained at suitable temperatures. For this reason, improved methods and approaches for determining, assessing, and evaluating specimen temperatures in electron microscopy would be useful.

SUMMARY

Methods comprise situating a thermal sensor thermally proximate a sample, imaging at least a portion of the thermal sensor, and assessing a temperature of the sample based on an image brightness or a current associated with the thermal sensor. According to some examples, the thermal sensor is a superconductor material and assessing the temperature of the sample comprises determining whether the sample is at a temperature below or above a critical temperature associated with the superconductor material. In typical examples, the thermal sensor is situated on a sample holder and the sample holder includes at least one of a metallic grid and a perforated carbon film. The sample holder can include a conductive perimeter ring, and the thermal sensor can be situated on the conductive perimeter ring. The brightness of the thermal sensor can be determined by exposing the thermal sensor to a charged particle beam (CBP) such as an electron beam. In representative examples, based on an exposure of at least a portion of the thermal sensor to a charged particle beam (CPB), a CPB image of the exposed portion is formed, and temperature associated with the thermal sensor is determined based on the brightness of the thermal sensor in the CPB image. In some cases, the thermal sensor is in contact with or within the sample.

Sample holders for CPB microscopy comprise a sample support that defines a sample area for retaining a sample and at least one temperature sensor situated thermally proximate the sample area. In some examples, the sample support is a carbon film and the temperature sensor contacts or is thermally coupled to the carbon film. The sample holder can include a metallic grid in contact with the carbon film, wherein the temperature sensor contacts or is thermally coupled to the metallic grid. The sample holder can also include a conducting ring situated about at least a portion of the sample support that defines the sample area, wherein the temperature sensor contacts or is thermally coupled to the perimeter ring. The thermal sensor can be a high temperature superconductor (HTSC) having a critical temperature between −135° and −175° C. or a plurality of particles of a thermal sensor material secured to or in contact with the sample support.

CPB systems comprise a sample stage operable to retain a sample holder at a sample location and a thermal sensor situated thermally proximate the sample location, wherein the thermal sensor is configured to produce a thermal response signal based on a temperature associated with the sample location. A processor is coupled to the thermal sensor and operable to produce an indication of a sample holder temperature based on the thermal response signal. The systems can include at least one computer-readable medium having stored thereon a calibration of thermal response signal as a function of temperature as, for example, a look-up table. In some examples, the thermal response signal is one of an image brightness in a CPB image, resistance, resistivity, or current responsive to CPB exposure. According to some examples, the thermal sensor is secured to the sample holder or in contact with the sample holder. In typical examples, an image brightness of the thermal sensor is used to estimate sample holder temperature or sample temperature.

Methods for assessment of sample temperature in cryo-electron microscopy comprise situating a thermal sensor in thermal contact with a vitrified sample, directing an electron beam to the thermal sensor, and detecting backscattered electrons (BSEs) or secondary electrons (SEs) associated with the thermal sensor in response to the electron beam. An image of at least a portion of the thermal sensor is produced based on the detected SEs or BSEs and a temperature of the vitrified sample is determined based on the image portion.

The foregoing and other objects, features, and advantages of the disclosed technology will become more apparent from the following detailed description, which proceeds with reference to the accompanying figures.

DETAILED DESCRIPTION

In the examples described below, so-called high temperature superconductors (HTSCs) are used because they exhibit abrupt changes in resistivity at or near a critical temperature associated with a change from a normal conductor state to a superconductor state. HTSCs are convenient in the applications disclosed herein because they can have critical temperatures in ranges that are closer to customary sample temperatures for cryo-electron microscopy than those of low temperature superconductors (LTSCs).

However, LTSCs and other materials can be used as well as illustrated in some examples below. Any material having a variable electron microscope brightness that is dependent on temperature can be used as a thermal sensor.

Figure 2:
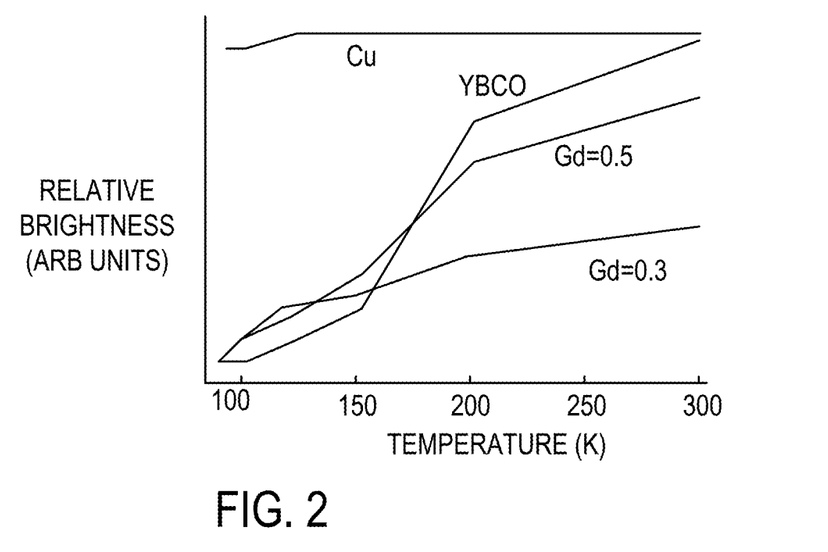
FIG. 2 illustrates representative CPB image brightness as a function of temperature for several representative HTSCs.

Image portion brightness is generally associated with detected secondary electrons or detected backscattered electrons in response to exposure to an electron beam. For typical thermal sensor materials (such as HTSCs), the thermal sensor material has a lower brightness when more conductive and a higher brightness when less conductive as shown in FIG. 2 for representative HTSCs.

By establishing material image brightness as a function of temperature, a material placed in thermal contact with or near a sample can be used to assess sample temperature. Large variations such as available with LTSCs and HTSCs can be convenient due to the large image brightness changes they can exhibit in particular temperature ranges. Image brightness can be based on material response to CPBs of any kind (often electron beams) or electromagnetic radiation such as visible, infrared (IR), far IR, ultraviolet (UV), extreme UV, X-ray, gamma ray radiation, or other radiation. In some examples, response spectra or one or more wavelengths of a response spectrum can be used to assess temperature. In such examples, a change in a spectrum is indicative of a temperature change, and particular spectra can be calibrated to permit temperature estimates based on a spectrum.

As used herein, critical temperature $T_C$ refers to a temperature associated with a conductor/superconductor transition and T* refers to a temperature at which a material's conductivity exhibits a non-linear change as a function of temperature. For HTSCs such as YBCO, such non-linear changes can occur at temperatures T* well above the conventional HTSC critical temperature $T_C$. Both of these temperatures are thus associated with changes in conductivity and in some cases, are associated with changes in secondary emission yield. These characteristics of HTSCs can be used to assess specimen temperatures in electron microscopy as described in detail below. However, other materials can be used such a LTSCs or other materials in which conductivity is a non-linear function of temperature, and HTSCs are only convenient examples. Other materials that exhibit linear or other changes in resistivity can also be used. HTSCs and LTSCs exhibit large changes at critical temperatures associated with their conductor-superconductor transitions. For other material such as materials with gradual or linear changes, calibration can be performed so that measured values of resistance, resistivity, image brightness, or other material-dependent property can be used to assess temperature.

The examples generally refer to electron microscopy, but other charged-particle beam systems can be similarly arranged. In addition, the disclosed systems, methods, and apparatus can be used in transmission electron microscopy, scanning electron microscopy, ion beam microscopy and in other CPB systems as well as light microscopy, confocal microscopy, fluorescence microscopy using laser or other light sources, X-ray imaging systems, or systems using other types of electromagnetic radiation. Some examples are described with reference to HTSC temperature sensors, but this is for convenient illustration, and other sensor materials can be used. A portion of an HTSC or other thermal sensor material (whether having linear or non-linear resistivity or other characteristic that is a function of temperature) is situated so that an assessment of the temperature of the portion permits estimation of sample temperature. A sample and a sensor material portion are referred to as thermally coupled if there is a thermally conductive path between the sample and the sensor material portion, whether coupled through one or more different materials or components. A sample and a sensor material are referred to as thermally proximate if temperatures of the sample and the sensor material are correlated to permit assessment of sample temperature based on sensor material portion temperature. Typically, sensor material portions are both thermally and physical proximate, and are thermally coupled for convenience. Temperatures in ranges of 15 K to 300K or higher or lower can be estimated.

Example 1

Figure 1:
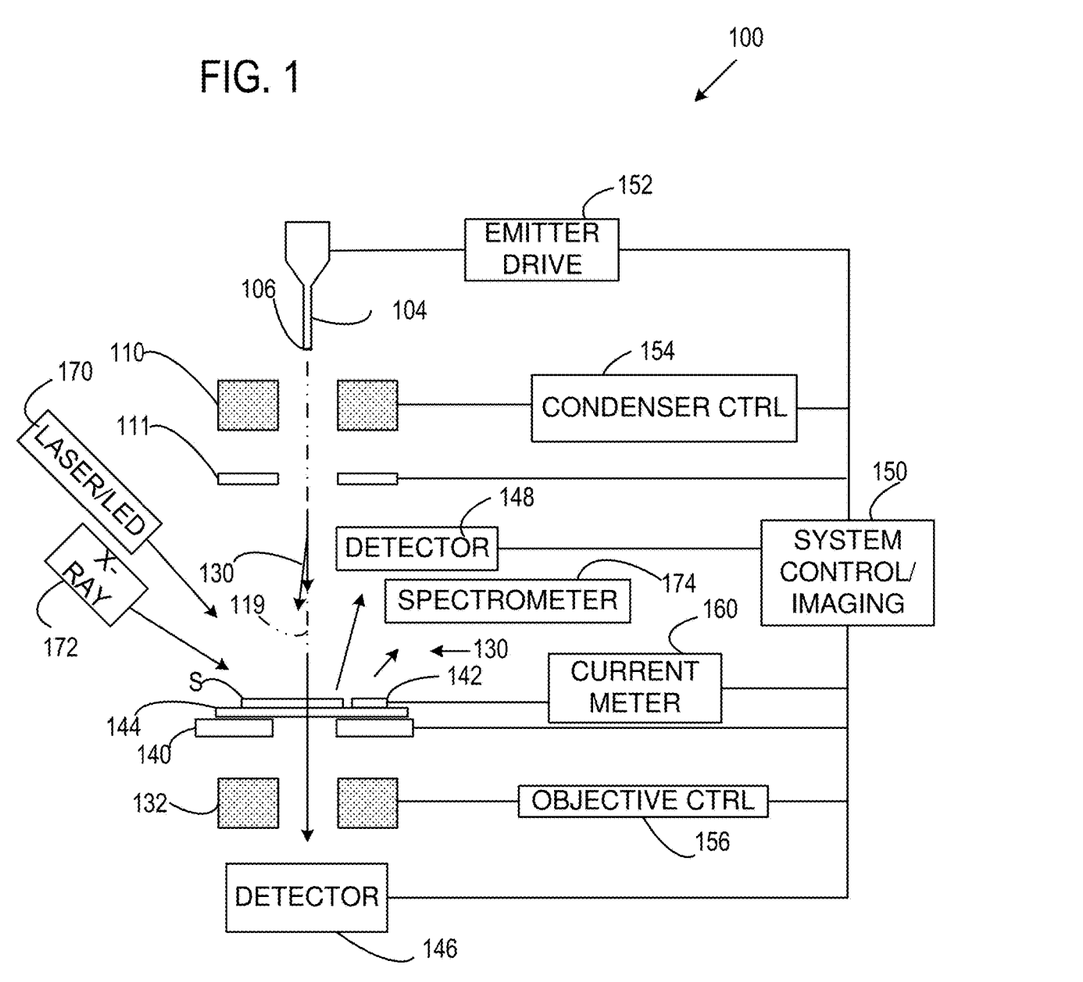
FIG. 1 illustrates a representative charged particle beam (CPB) system that includes a high temperature superconductor (HTSC) configured as a temperature sensor.

Referring to FIG. 1, a representative electron microscope system 100 includes an electron emitter 104 that is operable to emit electrons from a tip 106. A condenser lens 110 is situated to produce an electron beam from the emitted electrons and generally direct the electron beam along an axis 119. A beam deflector 111 is situated along the axis 119 and can selectively deflect or scan the electron beam with respect to a sample S and produce a deflected beam 130. The sample S is situated on a sample stage 140 than can permit translation and tilt adjustments of the sample S. The sample S is typically secured to or formed on a sample holder 144 that can include a sensing region 142 formed of an HTSC or other sensor material. An objective lens 132 is situated to direct the electron beam from the sample S to a detector 146. In some examples, one or more detectors such as detector 148 are situated to detect the electron beam or radiation responsive to the electron beam such as secondary electrons, X-rays, or other charged particles or electromagnetic radiation as indicated generally at 130.

In typical examples, the sample holder 144 includes a perforated support film of, for example, carbon, having a plurality of circular perforations. These perforations are often necessary for a rapid freezing process. A layer or discrete areas of frozen cells, proteins, or other samples of interest are situated on the perforated support film, embedded in a frozen liquid such as water. In CPB systems such as electron microscopes, coatings of a conductors such as one or more metals, carbon, or other materials are applied to reduce charging effects. The perforated carbon support film can be situated on a metal grid as discussed in detail below.

A system controller 150 is coupled to an emitter driver 152, a condenser controller 154, and an objective controller 156 (typically voltage or current sources) to establish operating conditions for electron microscopy. The system controller 150 is also coupled to the beam deflector 111 to control electron beam deflection and scanning. The system controller 150 is further coupled to the detectors 146, 148 and can produce images based on signals received from the detectors 146, 148. A current meter 160 is coupled to the sensing region 142 and the system controller 150 that is operable to assess specimen temperature based on measured current from the current meter 160. Alternatively, a relative brightness of the sensing region 142 in an electron beam image or other CPB image can be used either by the system controller 150 or by an instrument operator using a displayed image.

In some examples, an optical radiation source 170 such as one or more lasers, LEDS or other sources of electromagnetic radiation are situated to irradiate the sample S. An X-ray source 172 can also be provided, and radiation returned from the sample S can be direction to a spectrometer 174, such a charged particle or electromagnetic radiation spectrometer. In some examples, a system is configured for X-ray photoelectron spectroscopy or Raman spectroscopy. Generally, detectors can be situated to receive forward scattered charged particles and/or electromagnetic radiation and backscattered charged particles and/or electromagnetic radiation. Such additional sensors, sources, and detectors are generally coupled to the system controller 150.

Referring to FIG. 2, relative brightness of various sensing regions as functions of temperature are shown for the HTSC YBCO with various Gd doping levels and a conventional conductor (Cu). The table below lists a number of HTSCs as well as some conventional low temperature superconductors (LTSCs) (shown in italics). At temperature below $T_C$, material resistivity is zero.

| Material | Tc (° C.) | R at 20° C. (μΩ-m) |
| --- | --- | --- |
| Gallium | −272.0 | 0.14 |
| Aluminum | −271.9 | 0.03 |
| Indium | −269.8 | 0.08 |
| Tin | −269.5 | 0.11 |
| Mercury | −268.9 | 0.98 |
| Lead | −265.9 | 0.22 |
| Niobium | −263.8 | 0.14 |
| La-Ba-Cu-oxide | −255.2 | 0.8 |
| YBCO + 0.2% SnO2 | −193.15 | 100 |
| Y-Ba-Cu-oxide (YBCO) | −181.15 | 30 |
| Bi-2223 (BSSCO family) | −165.15 | 10 |
| Ti-Ba-Cu-oxide (TBCCO) | −148.15 | 5 |

Other HTSCs include the bismuth strontium calcium copper oxide (BSSCCO) family generally (including Bi-2223 in the table above).

Materials such as any of those listed above can be deposited by one of more of sputtering, evaporation, electroplating, chemical vapor deposition or other processes. Alternatively, such materials can be formed into strips, disks, particles, or other shapes and secured or placed thermally proximate a sample as needed. HTSC portions such as these, whether formed in place or as separate pieces are situated to be thermally coupled to a sample so that HTSC characteristics permit estimation of sample temperature.

Example 2

Figure 9A:
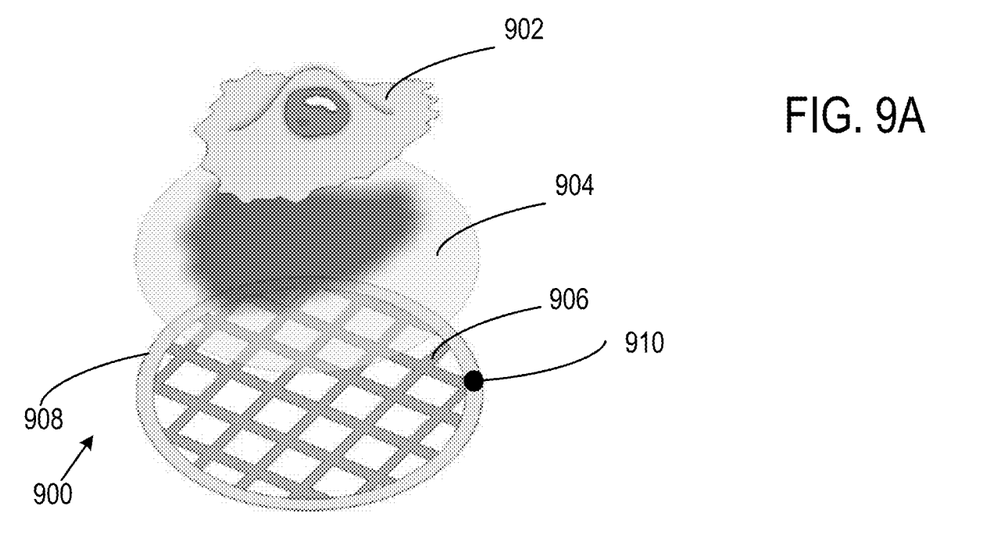
FIGS. 9A-9B illustrate a representative sample holder.
Figure 9B:
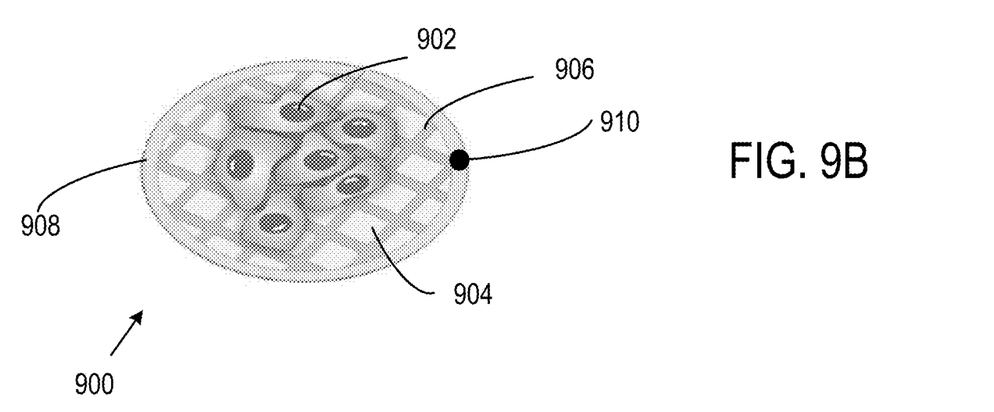

A representative sample holder 900 for use in the system of FIG. 1 is shown in FIGS. 9A-9B. A perforated carbon film 904 is situated to support a sample 903 (shown as one or more cells 902) and is in turn situated on a metal grid 906. A metal ring 908 is coupled to a perimeter of the metal grid 906. A temperature sensor material 910 is situated at or on the metal ring 908, but can be otherwise situated as discussed below.

Example 3

Figures 3A, 3B, 3C:
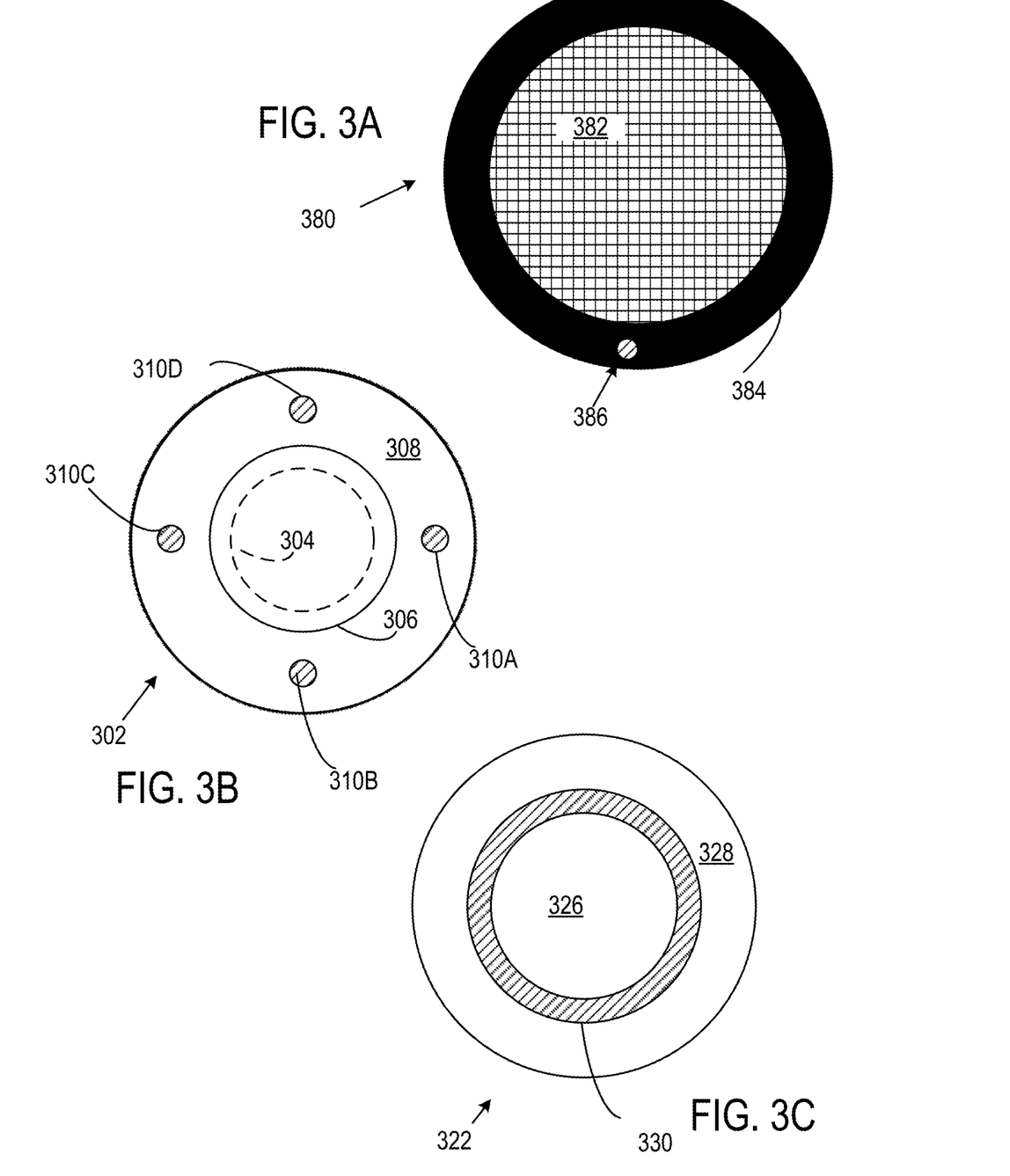
FIGS. 3A-3F illustrate representative sample holders that include HTSC patches.

Referring to FIG. 3A, a representative sample holder 380 includes a conductive grid 382 that is typically formed with a conductive perimeter ring 384, often of Cu, Rh, Au, or other metals. Areas between the grid lines can include a thin film such as an amorphous carbon film with a plurality of holes or perforations. Such a film is generally referred to as a "holey carbon film" and samples to be investigated can be secured on the film, typically by flash freezing. A temperature sensor 386 is situated on the perimeter ring 384, and additional sensors can be provide on the perimeter ring 384, the conductive grid 382 or areas between grid lines. The following examples generally pertain to the configuration of temperature sensors, and details of sample mounting such a carbon film are omitted in some cases for convenient illustration.

Example 4

Referring to FIG. 3B, a representative sample holder 302 includes a sample mounting region 306 which for TEM applications is typically includes a metallic grid and a thin membrane that permit electron beam transmission. The sample holder 302 also includes a perimeter region 308 that can be used to secure the sample holder 302 to a sample stage for one or more tilts or translations as required. The perimeter region 308 generally need not be as transmissive to an electron beam as the sample mounting region 306, but it can be convenient to provide both the sample mounting region 306 and the perimeter region 308 in a unitary substrate, such as a single grid or membrane. A transmissive aperture 304 can be provided as well. One or more temperature sensors 310A-310D can be situated in the perimeter region 308 and are thermally coupled to the sample mounting region 306. The temperature sensors 310A-310D can be formed of the same or different HTSCs or other materials exhibiting changes in resistivity or other characteristics at or near temperatures of interest. In many applications, sample temperature should be maintained at less than −135° C. to avoid sample devitrification, and a target temperature of −150° C. is used to provide a safe margin. For this temperature range, Bi-2223 and Ti—Ba—Cu-oxide HTSCs are convenient choices. The temperature sensors 310A-310D are situated in a particular arrangement in FIG. 3B, but other arrangements of fewer or more sensors can be used. In some examples, only a single temperature sensor is provided.

In applications such as SEM, sample mounts need not exhibit high electron beam transmissivity, and the sample mounting region 306 and the perimeter region 308 can be defined on, for example, a surface of a mounting post such as a metallic mounting post. Sensors can then be provided on sides or other locations of such posts as well as on the end surface which can serve as the sample mounting surface.

Example 5

Referring to FIG. 3C, a representative sample holder 322 includes a sample mounting region 326 which typically includes a metallic grid and a thin membrane. The sample holder 322 also includes a perimeter region 328 that can be used to secure the sample holder 322 to a sample stage. The perimeter region 328 and the sample mounting region 326 can be provided as regions of a unitary substrate, such as a single grid or membrane. A temperature sensor 330 can be situated in the perimeter region 308 and is thermally coupled to the sample mounting region 326. In this example, the temperature sensor 330 is an annular ring situated about the sample mounting region 326.

Example 6

Figure 3D:
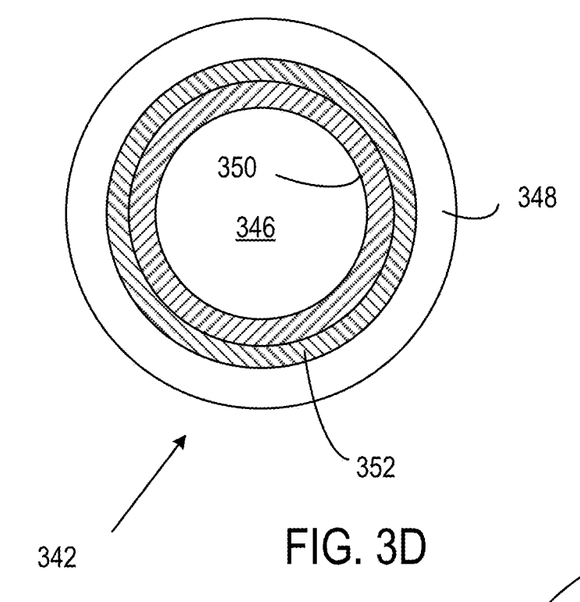

In an alternative configuration shown in FIG. 3D, a representative sample holder 342 includes a sample mounting region 346 situated within a perimeter region 348 that can be used to secure the sample holder 342 to a sample stage. The perimeter region 348 and the sample mounting region 346 can be provided as regions of a unitary substrate. Annular sensors 350, 352 are situated about the sample mounting region 346 and can be made of different sensor materials such as HTSCs having different critical temperatures. Additional annular sensors (or sensors of other shapes) can be provided and situated at or near the perimeter of the perimeter region 348 or near a sample location on sample mounting region 346.

Example 7

Figure 3E:
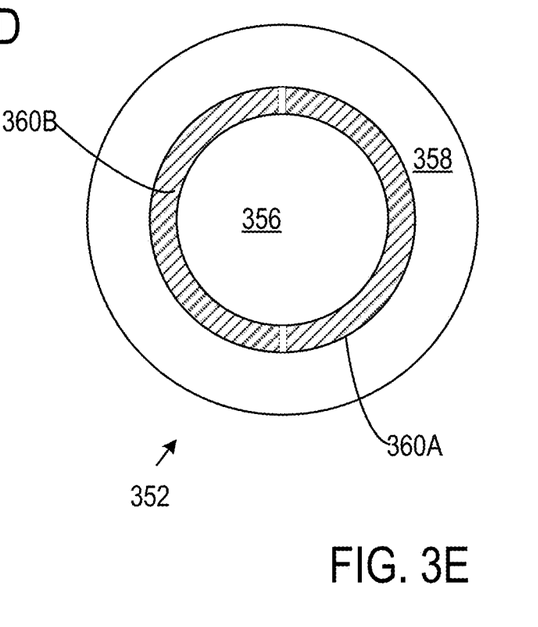

In another alternative configuration shown in FIG. 3E, a representative sample holder 352 includes a sample mounting region 356 situated within a perimeter region 358 that can be used to secure the sample holder 352 to a sample stage. The perimeter region 358 and the sample mounting region 356 can be provided as regions of a unitary substrate. An annular region about the sample mounting region 356 includes sensors 360A, 360B that can have be of HTSCs having different critical temperatures or other materials having different temperature responses.

Example 8

Figure 3F:
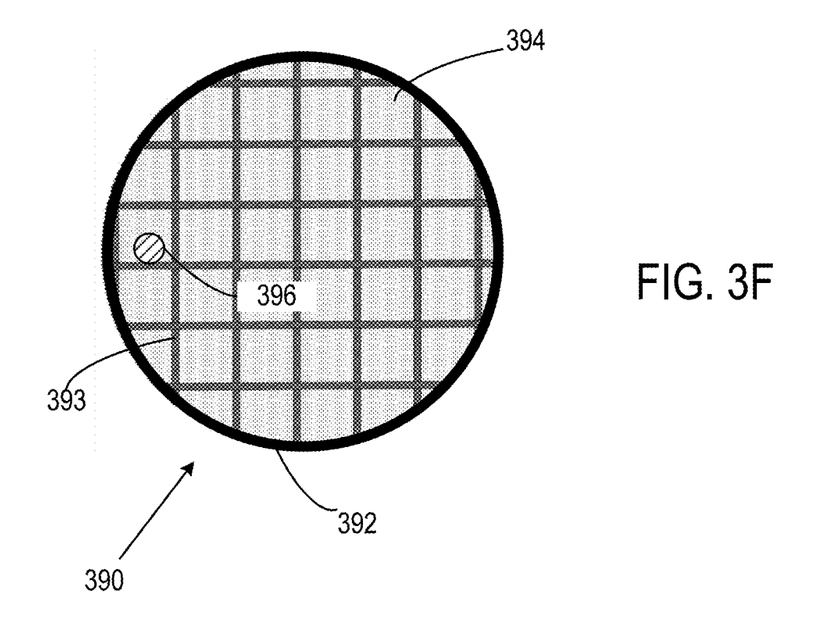

Referring to FIG. 3F, a sample holder 390 includes a conductive grid 393, a carbon or other film 394, and a conductive perimeter ring 392. A sensor 396 is situated on portion of the film 394 and the conductive grid 393.

Example 9

Figure 3G:
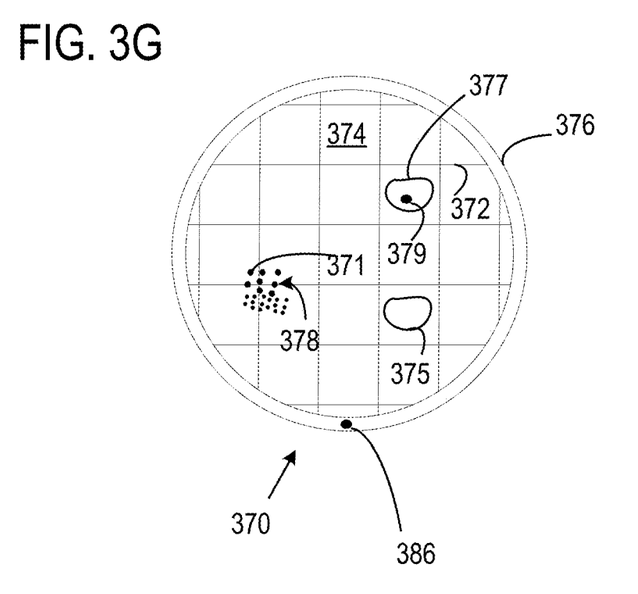
FIG. 3G illustrates another representative sample holder and associated temperature sensors.

Referring to FIG. 3G, a sample holder 370 includes a conductive grid 372, a carbon or other film 374, and a conductive perimeter ring 376. A sensor area 378 defined on the film 374 and the grid 372 includes one or a plurality of sensor particles 371. A representative sample cell 375 is situated on the film 374 and a representative sample cell 377 includes a temperature sensor particle 379 within the cell 377, placed therein by, for example, allowing the cell to ingest the temperature sensor particle 379.

Example 10

Figure 4A:
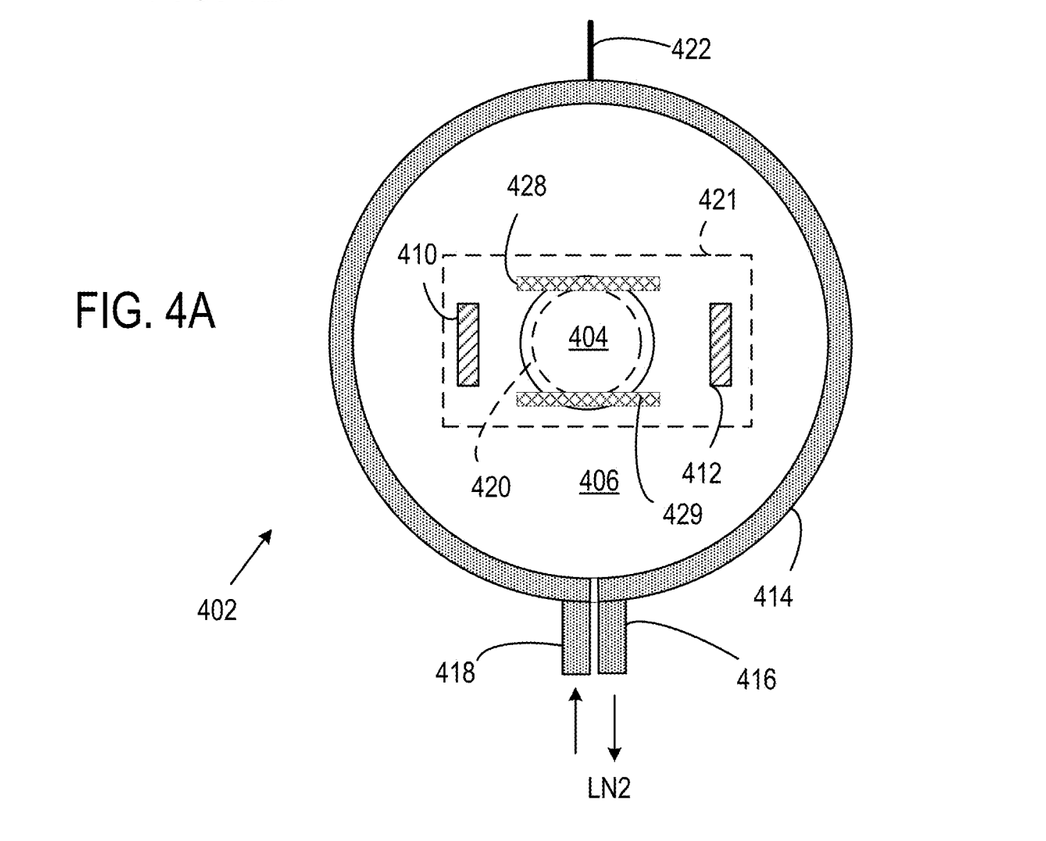
FIGS. 4A-4B illustrate representative sample stages that include HTSC patches.

Referring to FIG. 4A, a substrate stage 402 includes a sample holder mounting region 404 defined on a mounting surface 406. Typically, the substrate stage 402 includes one or more clips, screws, or other fasteners such as fasteners 428, 429 that can secure a sample holder such as metallic grid. The substrate stage 402 is generally situated so that a sample can be translated and tilted during image acquisition and/or sample preparation processes, such as ion milling. In some cases, a portion of the substrate stage 402 is tiltable for imaging or sample preparation, and such a portion is indicated schematically as 421. Coolant ports 416, 418 are fluidically coupled to a coolant chamber such a coolant tube 414 at a perimeter of the substrate stage 402 to permit flow of a coolant such as liquid nitrogen (LN2). One or more sensors such as sensors 410, 412 are situated on the mounting surface 406 and thermally coupled to the sample mounting region 404. An electrical connection 422 such a cable, wire, or conductive layer can provide an electrical connection to one or more of the substrate stage 402, the sample mounting region 404, and the sensors 410, 412. An electron beam transmissive aperture 420 can be provided as well.

Example 11

Figure 4B:
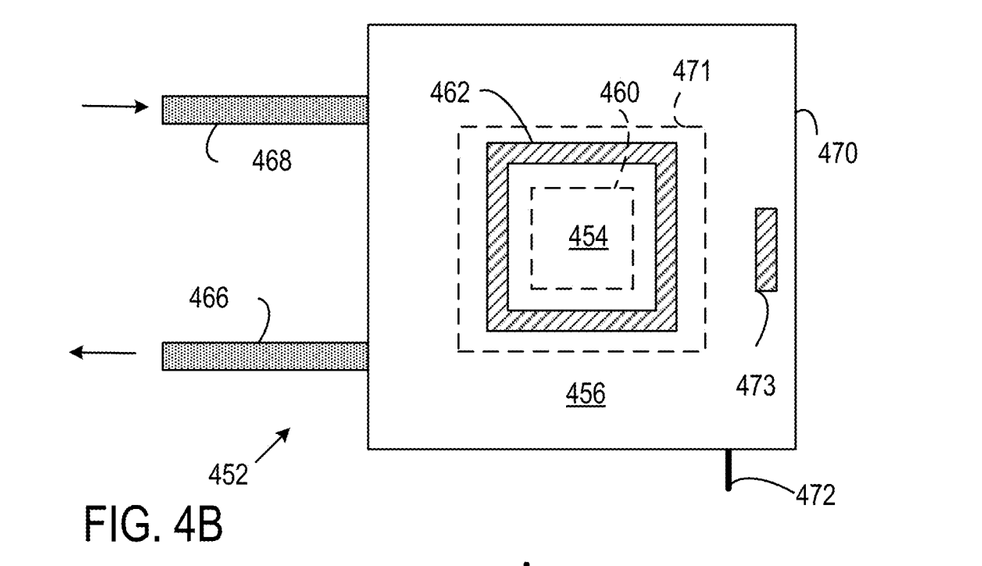

In another example shown in FIG. 4B, a substrate stage 452 includes a sample holder mounting region 454 defined on a mounting surface 456. Typically, the substrate stage 452 includes one or more fasteners that can secure a sample holder but are not shown in FIG. 4B. The substrate stage 452 is generally situated so that a sample can be translated and tilted during image acquisition and a tiltable portion is indicated at 471. Coolant ports 466, 468 are fluidically coupled to a coolant chamber such a coolant tubes or bores defined in a stage body 470 to permit flow of a coolant such as liquid nitrogen (LN2). A sensor 462 can be formed as a square, rectangular, or circular annulus on the mounting surface 456 and thermally coupled to the sample mounting region 454. As shown, the sensor 462 is situated on the tiltable portion 471. If desired, an additional sensor 473 can be situated on a fixed portion. An electrical connection 472 such a cable, wire, or conductive layer provides an electrical connection to the substrate stage 452 and the sample mounting region 454 as well as one or both of the sensors 460, 473. An electron beam transmissive aperture 460 can be provided as well.

Example 12

Figure 5:
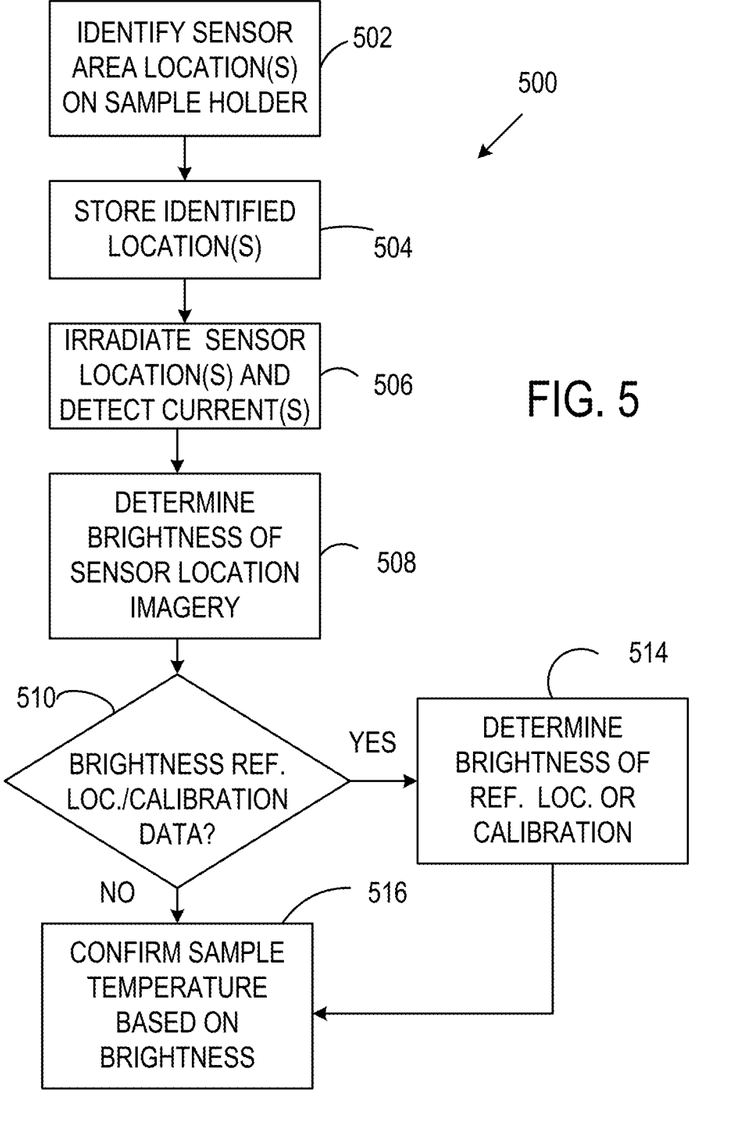
FIG. 5 illustrates a representative method of assessing sample temperature using an HTSC patch.

A representative method 500 of assessing temperature based on sensor regions such as discussed above includes identifying sensor area locations on a sample holder or sample stage at 502, and storing coordinates associated with the identified locations at 504. At 506, some or all of the available sensor areas are irradiated and associated currents are measured. Typically the electron beam is deflected or otherwise shaped to be incident to the sensor areas and sensor areas can be sequentially or simultaneously irradiated. Images or image portions associated with the sensors areas are evaluated at 508 to determine a relative brightness based on detected currents associated with the sensor areas. In some examples, a single sensor area is used, and a sensor area image can be a single pixel or multiple pixels for some or all sensor areas. For sensors that are positioned within a normal field of view, deflection or diversion of an electron beam to the sensor areas is not required. At 510 it can be determined if sensor area brightness is to be compared to one or more reference area brightnesses or calibration values. If so, at 514, brightness of one or more reference areas is determined, which may or may not require an additional electron beam diversion or deflection. Brightness of reference area can be based upon previously stored values, and additional measurement is not required. At 516, a sample temperature or temperature range can be confirmed, such as above or below a temperature based on a critical temperature associated with sensor materials used. More generally, a measured brightness can be compared with a calibration curve or calibration data that permits temperature estimation based on measured brightness. For example, a sensor area temperature can be varied and associated brightnesses measured, and the resulting temperature-brightness data used to establish sensor calibration. In some examples, a calibration curve is fit to the measured data and so temperature can be determined from the calibration curve. Alternatively, the measured data can be used with an interpolation procedure to calculate sensor temperature. In other examples, current at the sensor can be measured, without image display or formation.

While image portion brightness can be determined using backscattered CPB portions or secondary emission, in some examples, an image of a sample and/or a sensor area is displayed, and an operator can assess sample temperature by inspecting one or more displayed images. For convenience, one or more reference images of one or more pixels can be displayed with brightnesses corresponding to one or more temperature values. An operator can then estimate a sample temperature with a visual comparison. If multiple sensor materials are used, image inspection can further permit assessing sample temperature or temperature range. For example, one sensor area can have a brightness associated with being below a first critical temperature of a first HTSC while another indicates a temperature above a second critical temperature so that the sample temperature can be assessed as being between the first and second critical temperatures.

Example 13

Figure 6:
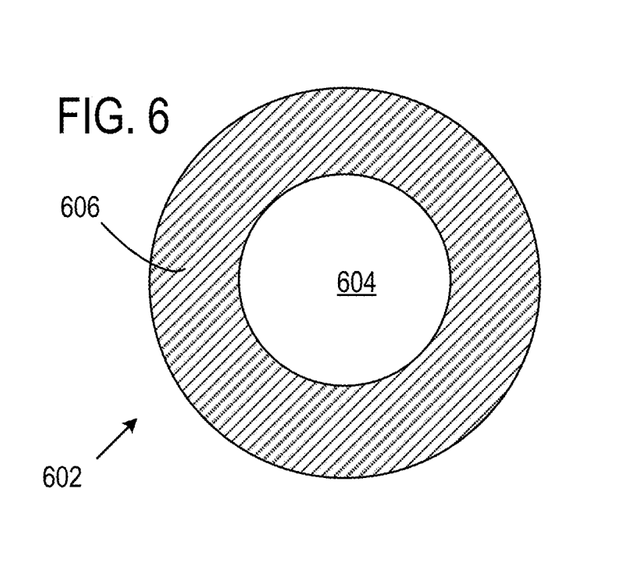
FIG. 6 illustrates a representative sample holder that includes an HTSC covered area.

HTSCs and other materials that exhibit linear, nonlinear, or other changes in resistance can be used to determine temperature profiles so that sample and stage temperatures can be further assessed. Referring to FIG. 6, sample holder 602 includes a sample mounting area 604 that is surrounded by a sensor material 606. By diverting an electron beam to various portions of the sensor material 606, temperature across the sample holder 602 can be assessed. In some cases, a temperature profile of a sample holder can be obtained. If desired, temperature profiles for multiple cooling conditions can be obtained such as for different sample stages, different coolants, and different coolant flow rates. In some cases, a sensor material can be situated in the sample mounting area 604 (or the sample holder 602 can be provided with sensor material on the entire surface) to permit assessment of temperature offsets between more peripheral sensors and the sample area 602. Such temperature profiles can be stored in a computer-readable memory. As discussed previously, for sensor areas within a standard field of view, additional electron beam deflection is not needed for imaging or measurement of sensors.

Figure 7:
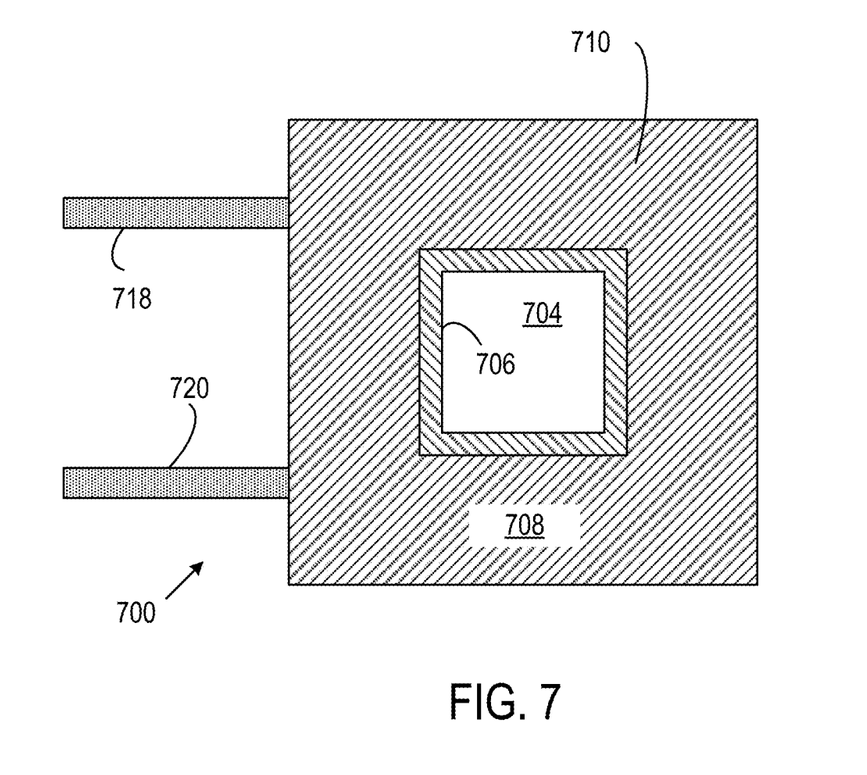
FIG. 7 illustrates a representative sample stage that includes an HTSC covered area.

Referring to FIG. 7, a sample stage 700 includes a sample holder mounting area 704 that is surrounded by a first sensor 706 and a second sensor 708 that substantially cover a mounting surface 710. Coolant couplings 718, 720 are coupled to cooling tubes or cavities not shown in FIG. 7. Interrogation of the sensors 706, 708 permits assessment of temperature across the mounting surface 710 and such assessment can be made as a function of cooling conditions such as coolant flow rate or temperature or other variables.

Example 14

Figure 8:
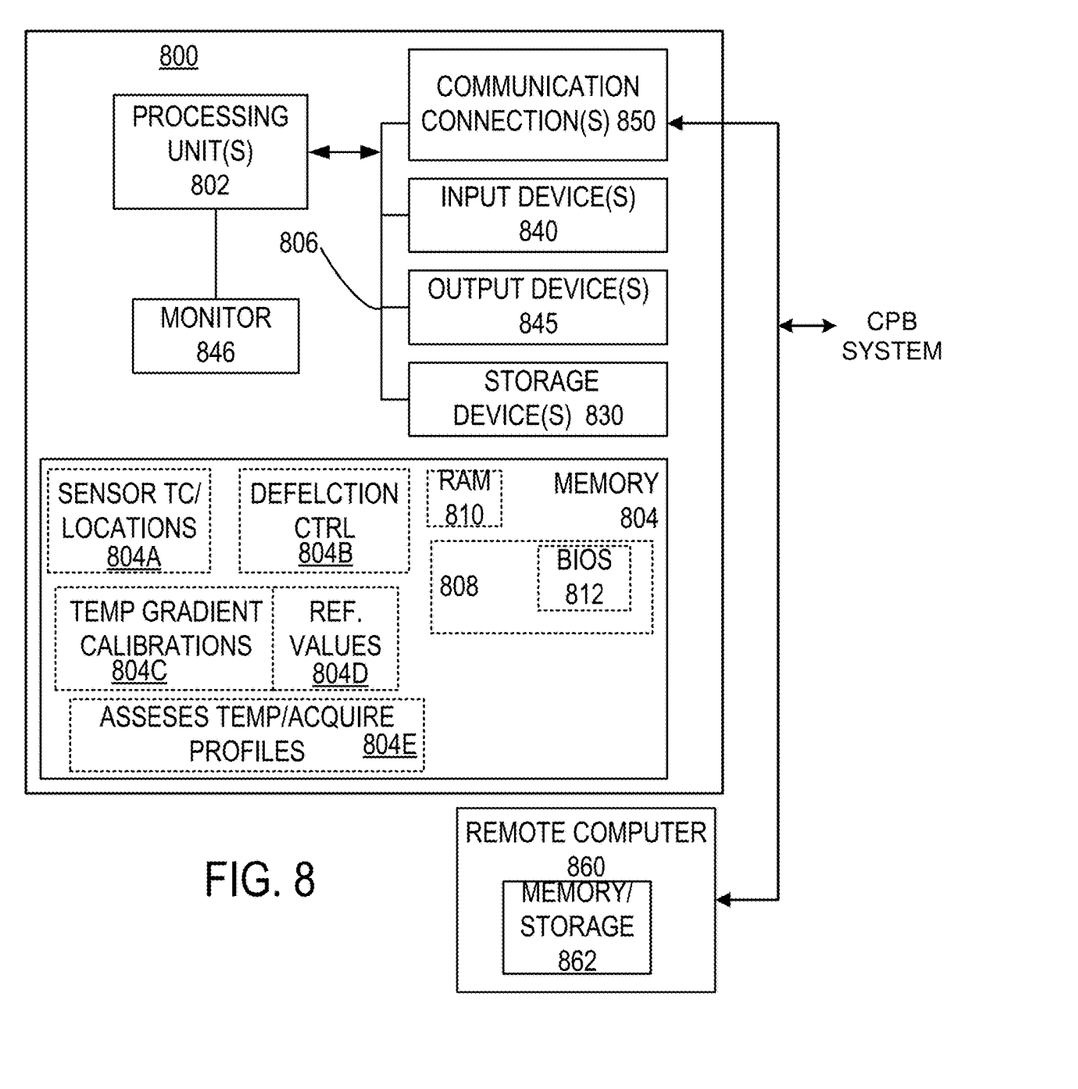
FIG. 8 illustrates a representative computing environment for performing the disclosed methods.

FIG. 8 and the following discussion are intended to provide a brief, general description of an exemplary computing environment in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 8, an exemplary system for implementing the disclosed technology includes a general purpose computing device in the form of an exemplary conventional PC 800, including one or more processing units 802, a system memory 804, and a system bus 806 that couples various system components including the system memory 804 to the one or more processing units 802. The system bus 806 may be any of several types of bus structures including a memory bus or memory controller, a peripheral bus, and a local bus using any of a variety of bus architectures. The exemplary system memory 804 includes read only memory (ROM) 808 and random access memory (RAM) 810. A basic input/output system (BIOS) 812, containing the basic routines that help with the transfer of information between elements within the PC 800, is stored in ROM 808.

The exemplary PC 800 further includes one or more storage devices 830 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 806 by a hard disk drive interface, a magnetic disk drive interface, and an optical drive interface, respectively. The drives and their associated computer readable media provide nonvolatile storage of computer-readable instructions, data structures, program modules, and other data for the PC 800. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 830 including an operating system, one or more application programs, other program modules, and program data. A user may enter commands and information into the PC 800 through one or more input devices 840 such as a keyboard and a pointing device such as a mouse. Other input devices may include a digital camera, microphone, joystick, game pad, satellite dish, scanner, or the like. These and other input devices are often connected to the one or more processing units 802 through a serial port interface that is coupled to the system bus 806, but may be connected by other interfaces such as a parallel port, game port, or universal serial bus (USB). A monitor 846 or other type of display device is also connected to the system bus 806 via an interface, such as a video adapter. Other peripheral output devices, such as speakers and printers (not shown), may be included.

The PC 800 may operate in a networked environment using logical connections to one or more remote computers, such as a remote computer 860. In some examples, one or more network or communication connections 850 are included. The remote computer 860 may be another PC, a server, a router, a network PC, or a peer device or other common network node, and typically includes many or all of the elements described above relative to the PC 800, although only a memory storage device 862 has been illustrated in FIG. 8. The personal computer 800 and/or the remote computer 860 can be connected to a logical a local area network (LAN) and a wide area network (WAN). Such networking environments are commonplace in offices, enterprise wide computer networks, intranets, and the Internet.

When used in a LAN networking environment, the PC 800 is connected to the LAN through a network interface. When used in a WAN networking environment, the PC 800 typically includes a modem or other means for establishing communications over the WAN, such as the Internet. In a networked environment, program modules depicted relative to the personal computer 800, or portions thereof, may be stored in the remote memory storage device or other locations on the LAN or WAN. The network connections shown are exemplary, and other means of establishing a communications link between the computers may be used.

The PC 800 is coupled to communicate with a CPB system and/or control the CPB system. The memory 804 can include a memory portion 804A that stores sensor temperature characteristics or calibration data and sensor area locations, a memory portion 804B that provides CPB defection control, a memory portion 804C that stores temperature profiles of stages or sample holders, a memory portion 804D that stores reference values such as current or image brightness values from non-sensor areas, and a memory portion 804E that includes computer-executable instructions for comparing sensor values (current or brightness), calculating expected sample temperature based on stored temperature profiles, and/or acquiring temperature profiles.

GENERAL CONSIDERATIONS

The above examples pertain to electron microscopy for convenient illustration, but other CPB systems or systems based on electromagnetic radiation such as light microscopes or X-ray systems can be used. Temperature assessment of a sample can be conveniently made using a brightness of a sensor area in an image. As used herein, brightness refers to apparent visual brightness in a displayed image or an associated brightness value in a stored or storable representation of an image or image portion such as in JPEG, TIFF, bitmap, or other representation. Brightness can be obtained as a function of wavelength, charged particle energy, or other parameters as well as being a function of temperature. Brightness can be normalized to range from dark (0) to light (1) or other values.

Areas that are provided with sensor materials are referred to herein as sensors, sensor areas, sensor patches, or temperature sensors for convenience. Image refers to displayed images presented for visual observation by an instrument operator as well as stored values that can be used to provide a visual image.

Figure 10:
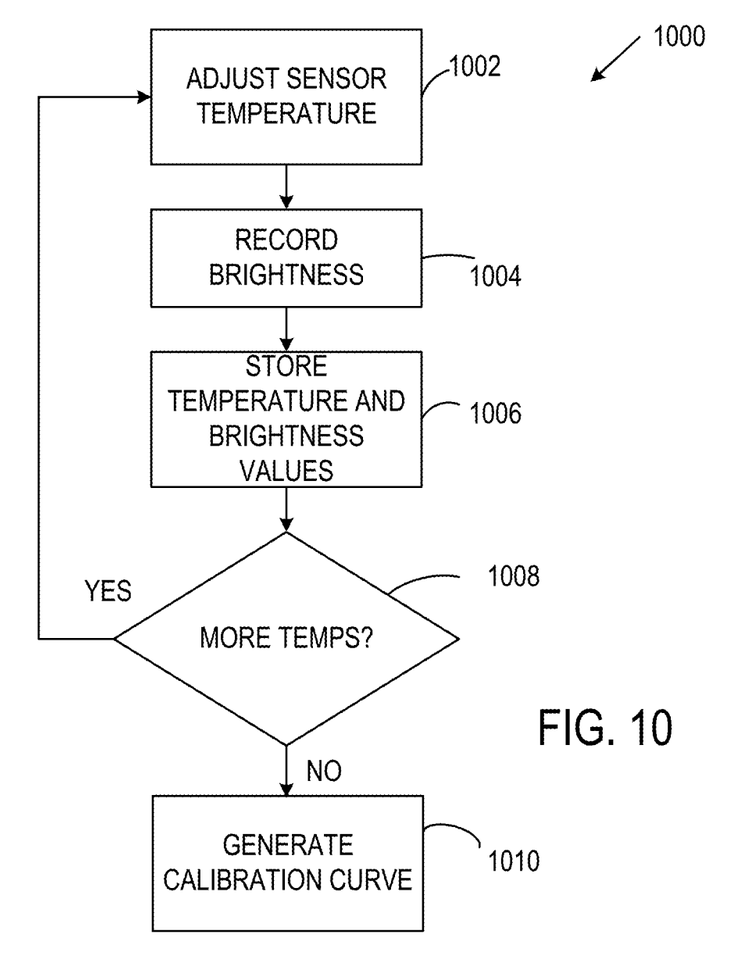
FIG. 10 illustrates a representative calibration method.

Referring to FIG. 10, a representative calibration method 1000 includes setting a sensor temperature at 1002 and recording sensor brightness (or other parameter) at 1004. The set temperature and brightness are stored in a computer-readable memory at 1006. If additional temperatures are of interest as determined at 1008, an additional temperature is set at 1002 and measurement of brightness and storage of data repeats. If no additional temperatures are to be used, a calibration curve or table can be produced at 1010. In some cases, an analytical fit can be generated such that temperature T=T(B), wherein B is brightness.

As used herein, sample refers to sample to be investigated such as a biological sample, and not sample supports, metallic grids, carbon film, and the like.

The resistivity changes or other sensor changes as functions of temperature can be interrogated by measurement of currents responsive to CPB irradiation such as secondary emission or backscattered CPB portion associated with sensor areas. Such currents can be used in forming images of thermal sensors. As used herein, higher brightnesses are associated with larger detected currents as in typical CPB images, but reverse contrast images can also be used. In some cases, one or more reference areas (i.e., non-sensor areas) are similarly interrogated for comparison with sensor areas for temperature assessment. The disclosed approaches are especially suited for cryo-electron tomography using suitable sample tilt mechanisms and image reconstruction methods.

It is convenient that sensor materials have large resistivity differences in temperature ranges of interest. HTSCs have zero resistance below their critical temperatures so that a ratio of resistivity above and below the critical temperature is very large (and theoretically infinite). Other materials that exhibit resistivity ratios of 2.5:1, 5:1, 10:1; 20:1, 50:1 or more within a selected temperature range (often between −175° C. and −135° C. for cryo-electron microscopy) can be used for convenience. Generally, any material can be used along with calibration as a function of temperature. Material properties such as optical reflectance and transmittance, secondary emission yield, optical spectra, resistivity, and other can be used as well.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation. As used herein, thermal contact does not require a direct physical contact but only a thermally conductive path.

In view of the many possible embodiments to which the principles of the disclosed technology may be applied, it should be recognized that the illustrated embodiments are only preferred example and should not be taken as limiting the scope of the disclosure. We therefore claim all that comes within the scope and spirit of the appended claims.

I claim:

1. A method, comprising:
   situating a thermal sensor thermally proximate a sample situated on a sample holder, wherein the thermal sensor is a high temperature superconductor (HTSC) material;
   imaging at least a portion of the thermal sensor; and
   assessing a temperature of the sample based on a brightness of the imaged portion of the thermal sensor or a current associated with the imaged portion of the thermal sensor.

2. The method of claim 1, wherein the assessing temperature of the sample comprises determining whether the sample is at a temperature below or above a critical temperature associated with the HTSC material.

3. The method of claim 1, wherein the sample holder includes one or more of a conductive perimeter ring, a metallic grid, and a perforated carbon film, and the thermal sensor is situated on the conductive perimeter ring, the metallic grid, or the perforated carbon film.

4. The method of claim 1, further comprising determining the brightness of the thermal sensor by exposing the thermal sensor to a charged particle beam (CPB).

5. The method of claim 1, further comprising, based on an exposure of at least a portion of the thermal sensor to a charged particle beam (CPB), forming a CPB image of the exposed portion, and determining the temperature associated with the thermal sensor based on the brightness of the thermal sensor in the CPB image.

6. The method of claim 1, wherein the thermal sensor is in contact with or within the sample.

7. The method of claim 1, further comprising selecting the HTSC material based on a devitrification temperature associated with a biological sample in ice, wherein the assessing the temperature of the sample comprises determining whether the sample is at a temperature below or above a temperature associated with devitrification of the biological sample embedded in ice.

8. The method of claim 7, wherein the HTSC material is selected to have a critical temperature that is less than the temperature associated with the devitrification of the biological sample embedded in ice.

9. A sample holder for CPB microscopy, comprising:
   a sample support that defines a sample area for retaining a sample, wherein the sample support is a carbon film or a metallic grid;
   a perimeter conducting ring situated about at least a portion of the sample support that defines the sample area; and
   at least one temperature sensor situated on the perimeter conducting ring and thermally proximate the sample area, wherein the at least one temperature sensor includes a plurality of high temperature superconductor (HTSC) materials having different critical temperatures, each HTSC material situated at a respective location on the perimeter conducting ring.

10. A system, comprising:
    a sample stage operable to retain a charged-particle beam (CPB) CPB transmissive sample holder at a sample location;
    a high temperature superconductor (HTSC) material operable to contact the CPB transmissive sample holder and coupled to the CPB transmissive sample holder, wherein the HTSC material is configured to produce a thermal response signal based on a temperature associated with the sample location; and
    a processor coupled to the high temperature superconductor (HTSC) material and operable to produce an indication of a sample holder temperature based on the thermal response signal, wherein the thermal response signal is a CPB image of the HTSC material.

11. The system of claim 10, further comprising at least one computer-readable medium having stored thereon a calibration of thermal response signal as a function of temperature.

12. The system of claim 11, wherein the calibration is stored as a look-up table.

13. The system of claim 10, further comprising the CPB transmissive sample holder, wherein the HTSC material is secured to the CPB transmissive sample holder.

14. The system of claim 13, wherein the CPB transmissive sample holder includes a carbon film or a metallic grid and a perimeter conducting ring situated about at least a portion of the CPB transmissive sample holder that defines a sample mounting area,
    at least one temperature sensor situated on the perimeter conducting ring and thermally proximate the sample mounting area.

15. The system of claim 14, wherein the HTSC material is secured to the CPB transmissive sample holder within the sample mounting area.

16. The system of claim 15, wherein the HTSC material is secured to the perimeter conducting ring.

17. The system of claim 16, wherein the HTC material has a critical temperature between −135° and −175° C.

18. The system of claim 14, wherein HTSC material comprises a plurality of HTSC materials, each associated with a different critical temperature and situated on one or more of the carbon film, the conducting grid, and the perimeter conducting ring.

19. A method for assessment of sample temperature in cryo-electron microscopy, comprising:
    situating a thermal sensor that includes a high temperature superconductor (HTSC) material in thermal contact with a with a biological sample embedded in ice;
    directing an electron beam to the thermal sensor and detecting a current associated with one or more of a backscattered electron intensity, a secondary emission intensity, or a conductivity associated with the thermal sensor in response to the electron beam;
    producing an image of at least a portion of the thermal sensor based on the detected current; and
    based on the image of at least the portion of the thermal sensor, determining whether a sample is at a temperature below or above a temperature associated with devitrification of the biological sample embedded in ice.

* * * * *

UNITED STATES PATENT AND TRADEMARK OFFICE
CERTIFICATE OF CORRECTION

| | | |
|---|---|---|
| PATENT NO. | : 12,070,753 B2 | Page 1 of 1 |
| APPLICATION NO. | : 16/834973 | |
| DATED | : August 27, 2024 | |
| INVENTOR(S) | : Drahotsky | |

It is certified that error appears in the above-identified patent and that said Letters Patent is hereby corrected as shown below:

In the Claims

Column 14, Line 53, Claim 19, "with a with a biological sample embedded in ice;" should read --with a biological sample embedded in ice;--

Signed and Sealed this
Eleventh Day of March, 2025

Coke Morgan Stewart
*Acting Director of the United States Patent and Trademark Office*